United States Patent [19]

Johnson et al.

[11] Patent Number: 4,481,261

[45] Date of Patent: Nov. 6, 1984

[54] BLISTER-RESISTANT DIELECTRIC

[75] Inventors: Gary W. Johnson, Stamford, Conn.; Ronald J. Schoonejongen, Carmel, N.Y.; David G. Hilson, II, Norwalk, Conn.

[73] Assignee: Electro Materials Corp. of America, Mamaroneck, N.Y.

[21] Appl. No.: 445,687

[22] Filed: Dec. 1, 1982

[51] Int. Cl.$^3$ .............................................. B32B 17/06
[52] U.S. Cl. ..................... 428/434; 29/830; 174/68.5; 252/514; 357/71; 357/73; 357/80; 361/321; 361/411; 428/433; 501/17; 501/20; 501/153
[58] Field of Search .......................... 501/17, 20, 153; 252/514; 427/96, 79; 361/320, 321, 322; 174/68.5; 428/433, 434; 357/73, 80

[56] References Cited

U.S. PATENT DOCUMENTS

| | | | |
|---|---|---|---|
| 3,808,042 | 4/1974 | Dietz | 427/96 |
| 3,909,277 | 9/1975 | Dube | 501/20 |
| 4,051,074 | 9/1977 | Asada | 252/514 |
| 4,235,944 | 11/1980 | Felten | 252/514 |
| 4,267,074 | 5/1981 | Holmes et al. | 252/514 |
| 4,318,830 | 3/1982 | Horowitz | 252/514 |

*Primary Examiner*—Helen M. McCarthy

[57] ABSTRACT

A blister-resistant thick film dielectric is usable with multilayer circuits having one conductor layer comprising gold and another conductor layer comprising silver to prevent blistering and other unwanted phenomena resulting from an adverse electrochemical reaction from occurring between the conductor layers during the firing process. The dielectric is comprised be weight, without vehicle, of about 50% lead-boro-silicate glass, between about 25% to about 40% $Al_2O_3$ and between about 10% to 25% an oxide mixture comprised of $Co_2O_3$, $Cr_2O_3$ $Fe_2O_3$, said oxide mixture having been heated to about 1000° C. for about 24 hours. In a preferred embodiment the dielectric is comprised by weight, without vehicle, of about 50% lead-boro-silicate, about 40% $Al_2O_3$ and about 10% oxide mixture. The oxide mixture in a preferred embodiment is comprised by weight of about 37.4% $Co_2O_3$, about 25.6% $Cr_2O_3$ and about 37.0% $Fe_2O_3$.

5 Claims, No Drawings

BLISTER-RESISTANT DIELECTRIC

The present invention relates generally to a thick film dielectric useful in the manufacture of thick film electronic circuits. The thick film dielectric of the present invention is adapted to prevent blistering and other unwanted phenomena which result from an electrochemical reaction which frequently occurs during the firing process when a silver conductor is used in conjunction with a gold conductor in a thick film multilayer circuit.

A thick film circuit generally comprises a substrate, a base conductor layer, a dielectric layer, a second conductor layer, a resistor layer, chip components, and interconnections of various types.

The conductors in such thick film circuits are generally either silver-based or gold-based. That is, they rely on either silver, or gold, as the predominant conductive element of the conductor. Heretofore, both the base conductor layer and the second conductor layer in a multilayer conductor configuration have been constituted of the same material (either both gold, or both silver and/or its alloys) due to an adverse electrochemical reaction which occurs when one of said conductor layers contains silver and the other is gold. In such multi-layer conductor configuration, the gold and silver-containing layers are in close proximity to one another, separated by the dielectric layer. In the prior art, the electrochemical reaction between the silver and gold causes the formation of blisters in the material used for the second conductor layer and can cause delamination of the entire base conductor-dielectric-second conductor structure.

It is preferable to have a multilayer conductor configuration which can be constituted of both gold and silver rather than to have either an all gold or an all silver multilayer conductor configuration. An all gold multilayer conductor configuration is, of course, most costly to make than a multilayer conductor configuration of both gold and silver. An all silver multilayer conductor configuration makes attachment of semiconductors difficult.

The prior art neither discloses nor suggests a thick film dielectric which is usable with a multilayer conductor configuration, constituted of both gold and silver. Further, the prior art does not disclose or suggest a thick film dielectric which prevents the aforementioned adverse electrochemical reaction between gold and silver conductor layers.

It is accordingly an object of the present invention to provide a thick film dielectric which permits the use of a multilayer conductor configuration including both gold and silver layers and which prevents an adverse electrochemical reaction between said layers.

Yet another object of the present invention is to provide a less expensive thick film microelectronic circuit.

Still another object of the present invention is to provide a thick film dielectric which prevents blister formation in the conductor layers.

It has been discovered that a thick film dielectric, which is comprised of a vehicle system, lead-boro-silicate glass, $Al_2O_3$, $Cr_2O_3$, $Co_2O_3$ and $Fe_2O_3$, is usable either between a base conductor layer constituted of gold and a second conductor layer constituted of silver or between a base conductor layer constituted of silver and a second conductor layer constituted of gold. The aforementioned thick film dielectric prevents the adverse electrochemical reaction between the gold and silver, and avoids the formation of blisters and the delamination of the conductor structure.

It has been found that the dielectric component (without vehicle) of the present invention should comprise by weight about 50% lead-boro-silicate glass, between about 25% to about 40% $Al_2O_3$ and between about 10% to about 25% combined oxide mixture. The preferred composition by weight of the dielectric component (without vehicle) is about 50% lead-boro-silicate glass, about 40% $Al_2O_3$ and about 10% combined oxide mixture.

It has been found preferable to have about 50% of the dielectric component (without vehicle) comprised of glass to enable the $Al_2O_3$ to adhere to the substrate. Additionally, it has been found preferable to use a sufficient amount of $Al_2O_3$ in the thick film dielectric to retain the preferred dielectric properties of the material. If the thick film dielectric (without vehicle) contains more than about 40% $Al_2O_3$ it becomes too porous, and may cause electrical shorts. If the thick film dielectric (without vehicle) does not contain a sufficient amount of $Al_2O_3$ it becomes too glassy, and the second conductor layer does not present a suitable surface for the various types of bonding generally required.

The oxide mixture appears to be the component of the thick film dielectric which prevents the blistering. The effectiveness of the oxide mixture as a blister-resistant agent varies with the exact percentage by weight composition of the oxide mixture. It has been found that the composition by weight of the oxide mixture should be between about 36% to about 38% $Co_2O_3$, between about 24% to about 28% $Cr_2O_3$ and between about 36% to about 38% $Fe_2O_3$. The preferred composition, by weight, of the oxide mixture is about 37.4% $Co_2O_3$, about 25.6% $Cr_2O_3$, about 37% $Fe_2O_3$. This preferred composition provides the most effective blister-resistant dielectric.

In practice the oxide mixture is manufactured by mixing the appropriate quantities of the afore-mentioned constituents in an appropriate vessel. The mixed constituents are placed in a suitable heat-treating furnace at a temperature of about 1000° C. for about 24 hours. Then the mixture is allowed to cool in the furnace to room temperature before removal therefrom.

In practice, the thick film dielectric of the present invention, when manufactured for application as a paste, is prepared in the following manner: The vehicle is formed by adding ethyl cellulose (in dry powder form) to terpineol. The ethyl cellulose absorbs the terpineol, such that a homogenous vehicle is formed. To the homogenous vehicle is added the dielectric component ($Al_2O_3$, the glass and the oxide mixture in the appropriate percentages). The thick film dielectric is, by weight, generally 75% dielectric component and 25% vehicle. The thick film dielectric paste is then mixed in a blender and put through a 3-roll milling process until a smooth homogenous material is obtained. If necessary, the viscosity of the thick film dielectric paste may be adjusted by adding thereto vehicle or terpineol. Those skilled in the art will know which material should be added to so adjust the vicosity. The desired viscosity of the thick film dielectric paste is between 150,000 through 250,000 cps.

In use, the thick film dielectric paste of the present invention is screen-printed onto an appropriate substrate. Typically, the substrate used is alumina, but any other appropriate substrate can be used. Next, the deposited material is dried at about 125° C. for about five to ten minutes. After drying, the deposited material is fired at between about 850° C. and 925° C. for about nine to eleven minutes. The preferred firing temperature is 850° C. plus or minus 5° C. The firing is generally done in a belt kiln, which should be continuously checked to insure proper firing temperature.

In practice the dielectric portion of the thick film multilayer construction is comprised of two layers deposited separately one on top of the other in a print, dry, fire sequence. This practice is followed to prevent pinholing. When applied, each layer is about 45 microns in wet thickness and after drying, each layer is about 25 microns in thickness. Each fired layer is about 14 to about 15 microns in thickness such that the fired dielectric portion has a total of thickness of between about 28 to about 30 microns.

It has been found that, the thick film dielectric of the present invention has a dielectric constant of about five and a voltage breakdown of between 500–600 V/mil. These values fall well within industry standards which require a maximum dielectric constant of between 10–12 and a minimal voltage breakdown of 500 V/mil.

As will be readily apparent to those skilled in the art, the invention may be used in other specific forms or for other purposes without departing from its spirit or central characteristics. The present embodiments are therefore to be considered as illustrative and not restrictive, the scope of the invention being indicated by the claims rather than by the foregoing description, and all embodiments which come within the range of equivalence of the claims are intended to be embraced.

What is claimed is:

1. A blister-resistant thick film dielectric usable with multilayer conductor configurations having one conductor layer comprising gold and another conductor layer comprising silver, said dielectric consisting essentially of, by weight and without vehicle, about 50% lead-boro-silicate glass, between about 25% to 40% $Al_2O_3$, and between about 10% to 25% of an oxide mixture consisting essentially of, by weight, about 36% to about 38% $Co_2O_3$, between about 24% to 28% $Cr_2O_3$ and between about 36% to 38% $Fe_2O_3$, said oxide mixture having been heated at about 1000° C. for about 24 hours.

2. The blister-resistant thick film dielectric of claim 1, in which there is about 40% $Al_2O_3$, and about 10% of said oxide mixture.

3. The thick film dielectric of claim 1, wherein said oxide mixture consists essentially of, by weight about 37.4% $Co_2O_3$, about 25.6% $Cr_2O_3$ and about 37.0% $Fe_2O_3$.

4. The thick film dielectric of claim 1, usable in combination with a vehicle comprised of dry ethyl cellulose and terpineol thereby forming a thick film dielectric paste.

5. The thick film dielectric of claim 1, wherein said thick film dielectric is situated between a base conductor layer constituted of gold and a second conductor layer constituted of silver.

* * * * *